(12) United States Patent
Huang et al.

(10) Patent No.: US 11,452,211 B2
(45) Date of Patent: Sep. 20, 2022

(54) EMBEDDED CIRCUIT BOARD AND METHOD OF MANUFACTURING SAME

(71) Applicant: SHENNAN CIRCUITS CO., LTD., Shenzhen (CN)

(72) Inventors: Lixiang Huang, Shenzhen (CN); Zedong Wang, Shenzhen (CN); Hua Miao, Shenzhen (CN)

(73) Assignee: SHENNAN CIRCUITS CO., LTD., Shenzhen (CN)

( * ) Notice: Subject to any disclaimer, the term of this patent is extended or adjusted under 35 U.S.C. 154(b) by 0 days.

(21) Appl. No.: 17/134,220

(22) Filed: Dec. 25, 2020

(65) Prior Publication Data
US 2022/0015238 A1    Jan. 13, 2022

Related U.S. Application Data

(63) Continuation of application No. PCT/CN2020/127015, filed on Nov. 6, 2020.

(30) Foreign Application Priority Data

Jul. 7, 2020   (CN) .......................... 202010645383.3

(51) Int. Cl.
*H05K 1/18* (2006.01)
*H05K 3/00* (2006.01)
(Continued)

(52) U.S. Cl.
CPC ........... *H05K 1/188* (2013.01); *H05K 1/0269* (2013.01); *H05K 3/0044* (2013.01); *H05K 3/027* (2013.01);
(Continued)

(58) Field of Classification Search
CPC ...... H05K 1/188; H05K 1/0269; H05K 1/115; H05K 2201/1003
(Continued)

(56) References Cited

U.S. PATENT DOCUMENTS

| 2008/0116562 A1* | 5/2008 | Lien | ...................... H01L 21/568 |
| | | | 257/E21.705 |
| 2015/0043183 A1* | 2/2015 | Ishiguro | ................. H05K 1/185 |
| | | | 174/251 |

(Continued)

FOREIGN PATENT DOCUMENTS

| CN | 1823555 A | 8/2006 |
| JP | 2009054930 A | 3/2009 |
| JP | 2013211426 A | 10/2013 |

OTHER PUBLICATIONS

International Search Report,international application No. PCT/CN2020/127015, dated Apr. 6, 2021.

*Primary Examiner* — Hoa C Nguyen

(57) ABSTRACT

The invention, which relates to the technical field of inductance embedding, specifically discloses an embedded circuit board. The embedded circuit board includes: at least layer of sub-body, where preset positions of the sub-bodies are provided with through slots; and an inductance element embedded within the slots and configured to be spaced apart from sidewalls of the slots. In the above manner, it is possible to make the embedded circuit board of the present application structurally compact, highly integrated, widely applicable, and safe and reliable.

12 Claims, 4 Drawing Sheets

(51) Int. Cl.
  *H05K 1/02*   (2006.01)
  *H05K 3/02*   (2006.01)
  *H05K 1/11*   (2006.01)

(52) U.S. Cl.
  CPC ...... *H05K 1/115* (2013.01); *H05K 2201/1003* (2013.01); *H05K 2203/0191* (2013.01); *H05K 2203/065* (2013.01)

(58) Field of Classification Search
  USPC .................................................. 361/761–766
  See application file for complete search history.

(56)         References Cited

U.S. PATENT DOCUMENTS

2018/0166206 A1*   6/2018   Ueyama .............. H01F 17/0013
2021/0068261 A1*   3/2021   Cho ....................... H05K 1/116

\* cited by examiner

EMBEDDED CIRCUIT BOARD AND METHOD OF MANUFACTURING SAME

CROSS-REFERENCE TO RELATED APPLICATIONS

The present disclosure is a continuation-application of International (PCT) Patent Application No. PCT/CN2020/127015 filed Nov. 6, 2020, which claims foreign priority of Chinese Patent Application No. 202010645383.3, filed on Jul. 7, 2020 in the China National Intellectual Property Administration, the contents of all of which are hereby incorporated by reference.

TECHNICAL FIELD

The present disclosure relates to the technical field of inductance embedding, and particularly to an embedded circuit board and a method of manufacturing a same.

BACKGROUND

Current electronic products are developing in a short, small, light and thin direction, while also having higher requirements for densities of circuit boards. However, in the design of the circuit boards, inductances are widely used, and inductance elements of power-supply circuit boards occupy more than 40% of surface areas of the power supply boards.

SUMMARY

The present disclosure provides an embedded circuit board and a method of manufacturing a same, which embedded circuit board is structurally compact and highly integrated.

In a first aspect, a method of manufacturing an embedded circuit board comprises: providing an inductance element and at least two layers of sub-bodies, where two layers of adjacent sub-bodies are each provided with communicating slots at corresponding positions; embedding the inductance element on inductance frames to form an inductance assembly; placing the inductance assembly into a slot of a first layer of sub-body and bonding the inductance assembly to the first layer of sub-body, where a distance between the inductance frames and sidewalls of the slots is 80 to 120 um; providing the remaining sub-bodies to sleeve the inductance element in sequence; and compressing the respective layers of sub-bodies to fix the sub-bodies and the inductance element.

In a second aspect, the present disclosure provides an embedded circuit board, which comprises: at least two layers of sub-bodies, where two layers of adjacent sub-bodies thereof are each provided with communicating slots at corresponding positions; and an inductance element embedded within the slots and configured to be spaced apart from sidewalls of the slots.

In a third aspect, the present disclosure provides a method of manufacturing an embedded circuit board, which method comprises: providing an inductance element and at least two layers of sub-bodies with slots in same positions; placing the inductance element into slots of the at least two layers of sub-bodies; and compressing the respective layers of sub-bodies to fix the sub-bodies and the inductance element, where the inductance element is configured to be spaced apart from sidewalls of the slots.

BRIEF DESCRIPTION OF THE DRAWINGS

In order to clearly illustrate technical solutions in embodiments of the present disclosure, drawings required to be used in the description of the embodiments will be briefly introduced below. Apparently, the drawings in the following description are only some embodiments of the present disclosure, and according to these drawings, persons ordinarily skilled in the art may further obtain other drawings without expending inventive labor.

DETAILED DESCRIPTION OF THE PREFERRED EMBODIMENTS

Technical solutions in the embodiments of the present disclosure will be clearly and completely described below in conjunction with the drawings in the embodiments of the present disclosure. Obviously, the described embodiments are merely a part of the embodiments of the present disclosure, rather than all the embodiments. All other embodiments obtained by those ordinarily skilled in the art based on the embodiments of the present disclosure without expending inventive labor fall into the protection scope of the present disclosure.

Figure 1:
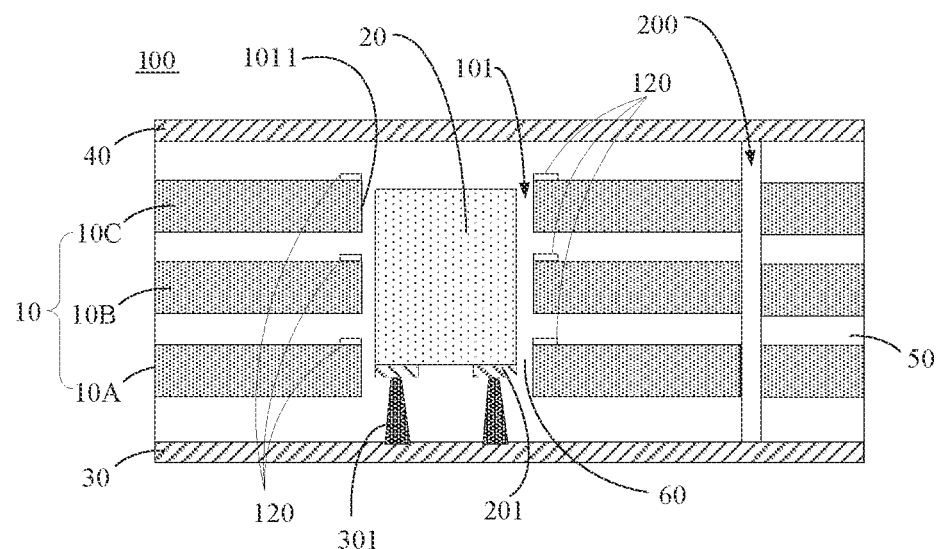
FIG. 1 is a schematic structural diagram of an embodiment of an embedded circuit board of the present disclosure.

With reference to FIG. 1, an embedded circuit board 100 may include at least one layer of sub-body 10 and an inductance element 20.

Preset position of the sub-bodies 10 are provided with through slots 101. The inductance element 20 is embedded within the slots 101 and is configured to be spaced from sidewalls 1011 of the slots 101.

According to an embodiment of the present disclosure, distinct from the case of the prior art, it is possible to make the circuit board structurally compact, highly integrated, and safe and reliable, by providing the preset positions of the sub-bodies 10 with the through slots 101, embedding the inductance element 20 within the slots 101, configuring the inductance element 20 to be spaced apart from the sidewalls of the slots 101 and performing compression via a compression process.

Further, when the number of sub-bodies is greater than or equal to 2, at least two layers of adjacent sub-bodies 10 are provided, at corresponding positions, with communicating slots 101, respectively.

Specifically, sub-bodies 10A, 10B, and 10C are each provided with a through slot 101. The through slot 101 of 10A is in communication with the through slot 101 of the adjacent sub-body 10B. The through slot 101 of 10C is in communication with the through slot 101 of the adjacent 10B. The circuit board 100 may have multiple layers of sub-bodies, which is not limited to the case in the present embodiment.

It is possible to make the circuit board structurally compact, highly integrated, and safe and reliable, by providing the preset positions of the sub-bodies 10 with the through slots 101, then configuring the sub-bodies 10B, 10C to sleeve the induction element 20 through the communicating slots 101, and finally fixing the respective layers of sub-bodies 10A, 10B, 10C and the induction element 20 via a compression process.

Alternatively, fusible dielectric layers 50 are provided between the sub-bodies 10A and 10B, and 10B and 10C. After sleeving the induction element 20 by means of the slots 101, the sub-bodies 10 are formed by laminating and compressing the fusible dielectric layers 50. At least a part of the fusible dielectric layers 50 flows into space between the induction element 20 and sidewalls of the slots 101 and contacts the induction element 20. Alternatively, the fusible dielectric layers 50 fill the space between the induction element 20 and the sidewalls of the slots 101; the fusible dielectric layers 50 solidify again to bond and fix the respective layers of sub-bodies 10A, 10B, and 10C, while enclosing the inductance element 20 and fixing the inductance element 20 to the respective layers of sub-bodies 10A, 10B, and 10C to form a high-strength and compact product structure.

In the present embodiment, a thickness of the fusible dielectric layers 50 is 40 to 300 um, for example, 240 um. The sub-bodies 10 may be copper-free core layers with a thickness of 200 to 500 um, for example, 400 um. The purpose of selecting the sub-bodies 10 to be copper-free core layers is to thicken the circuit board 100 for being embedded with a sufficient thickness into the inductance element 20. Of course, the sub-bodies 10 can also alternatively have copper core layers on which circuit can be arranged for circuit connection.

In an embodiment, the embedded circuit board 100 further includes a first circuit layer 30 and a second circuit layer 40. The first circuit layer 30 and the second circuit layer 40 cover two opposite ends of the slot 101 respectively, such that the inductance element 20 is located between the first circuit layer 30 and the second circuit layer 40.

Connection terminals 201 of the inductance element 20 may be provided at an end of the inductance element 20 adjacent to the first circuit layer 30. The first circuit layer 30 is provided with laser through-holes (not shown) provided with conductive columns 301. The connection terminals 201 of the induction element 20 are connected to the first circuit layer 30 via the conductive columns 301.

Alternatively, the connection terminals 201 of the inductance element 20 are provided at an end of the inductance element 20 adjacent to the second circuit layer 40. The second circuit layer is provided with laser through-holes provided with conductive columns (not shown). The connection terminals 201 of the inductance element 20 are connected to the second circuit layer 40 via the conductive columns.

Figure 2:
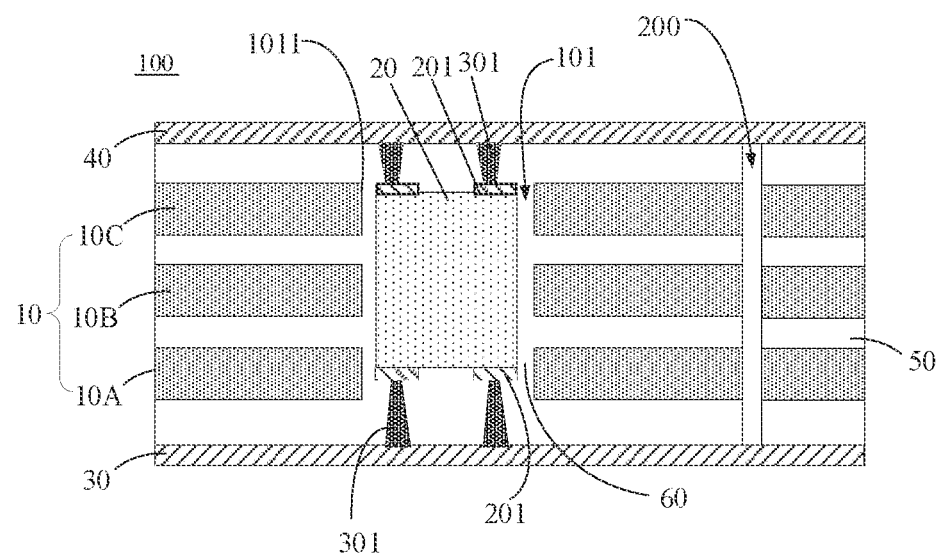
FIG. 2 is a schematic structural diagram of another embodiment of an embedded circuit board of the present disclosure.

With reference to FIG. 2, it is also possible to provide connection terminals 201 at each of an end of the inductance element 20 adjacent to the first circuit layer 30 and an end thereof adjacent to the second circuit layer 40, to provide laser through-holes at each of corresponding positions of the first circuit layer 30 and the second circuit layer 40, and to provide the laser through-holes with conductive column 301. The connection terminals 201 of the induction element 20 may be connected to the first circuit layer 30 and the second circuit layer 40 via the conductive columns 301.

In the present embodiment, corresponding positions of the sub-bodies 10 and the fusible dielectric layers 50 are each provided with conductive holes 200 for interlayer connection; and corresponding positions of the first circuit layer 30 and the second circuit layer 40 corresponding to the conductive holes 200 are provided with conductive blind holes. Therein, the connection terminals 201 of the inductance element 20 are electrically connected to the conductive blind holes of the second circuit layer 40 via the conductive blind holes of the first circuit layer 30 and the conductive holes in sequence.

Specifically, the sub-bodies 10 and the fusible dielectric layers 50 can be subjected to patterning treatment to form through-holes in the sub-bodies 10 and the fusible dielectric layers 50; and the through-holes are subjected to copper electroplating to form conductive layers on inner walls of the through-holes to obtain the conductive holes 200. The positions of the first circuit layer 30 and the second circuit layer 40 corresponding to the conductive holes 200 are provided with conductive blind holes, such that the connection terminals 201 of the inductance element 20 are electrically connected to the conductive blind holes of the second circuit layer 40 via the conductive blind holes of the first circuit layer 30 and the conductive holes 200 in sequence.

Alternatively, one or more components (not shown) are provided on a side of the first circuit layer 30 away from the slots or on a side of the second circuit layer 40 away from the slots. A plurality of components may be further provided on the side of the first circuit layer 30 away from the slots and the side of the second circuit layer 40 away from the slots, respectively. The components implement electrical connection to the inductance element 20 via the first circuit layer 30 or the second circuit layer 40. Therein, the components can be one or more of chips, capacitance elements, resistance elements, and power supply means.

In an embodiment, a first dielectric layer 50 is provided between two layers of sub-bodies 10, and a second dielectric layer 60 is provided between the inductance element 20 and sidewalls 1011 of the slots. The first dielectric layer 50 and the second dielectric layer 60 are welded by one-time compression.

During high-temperature compression, the first dielectric layers 50 melt to bond the adjacent sub-bodies 10 together, and a part of the first dielectric layers 50 flows into the space between the induction element 20 and the sidewalls 1011 of the slots, and contacts the induction element 20. The second dielectric layer 60 also melts. The first dielectric layers 50 and the second dielectric layer 60 are bonded together. After being cooled and solidified, the first dielectric layers 50 and the second dielectric layer 60 become an integral structure. Therein, the first dielectric layers 50 and the second dielectric layer 60 may be made of a same material or different materials.

Alternatively, the first dielectric layer 50 and the second dielectric layer 60 are made of an insulating material selected from the group consisting of resin and molding silicone resin glue, or any combination thereof. Therein, the molding silicone resin glue, which is a colorless and transparent liquid, has certain air permeability and elasticity, when solidified, and is mainly characterized by temperature resistance, weather resistance, electrical insulation, physiological inertia, low surface tension and low surface energy. The resin refers to an organic polymer, which has a softening or melting range after being heated, has a tendency to flow under the action of external forces when softened and is in a state of solid, semi-solid, or sometimes liquid at an ambient temperature.

Alternatively, at least two identification patterns 120 may be provided at a corresponding position of each layer of sub-body 10. Positioning holes, which are set with the identification patterns 120 as reference, may be configured to align the respective layers of sub-bodies 10 to accurately sleeve the induction element 20 by means of the respective slots 101, followed by compressing all the sub-bodies. By setting the positioning holes, it is possible to neatly arrange the respective layers of sub-bodies 10 when the sub-bodies 10 are provided to sleeve the induction element 20. Moreover, the induction element 20 may be accurately sleeved with the slots 101 of the sub-bodies 10, without being damaged, thereby improving the accuracy and yield.

In other embodiments, identification patterns 120 may be provided on the sub-bodies 10, and the slots 101 of the respective layers of sub-bodies 10 are provided with the identification patterns 120 as reference. Moreover, the slots 101 of the respective layers of sub-bodies 10 of a same shape and size are configured to align the respective layers of sub-bodies 10 to accurately sleeve the inductance element 20 by means of the respective slots 101, followed by compressing all the sub-bodies 10.

The identification patterns 120 are further configured to position the connection terminals 201 of the inductance element 20. Specifically, identification patterns 120 may be provided at a position of the first layer of sub-body 10A corresponding to the connection terminals 201 of the inductance element 20. The first layer of sub-body 10A and the first dielectric layer 50 adjacent to the first layer of sub-body 10A are laser-drilled according to the identification patterns 120, and the first circuit layer 30 or the second circuit layer 40 is also laser-drilled, such that laser through-holes are formed on the first layer of sub-body 10A and the first dielectric layer 50 adjacent to the first layer of sub-body and laser through-holes are also formed on the first circuit layer 30 or the second circuit layer 40.

Alternatively, the sub-bodies 10 are copper clad laminates, and copper foil layers on the sub-bodies 10 are etched by a chemical etching process to form identification patterns 120. Therein, the chemical etching process refers to a method of removing materials by etching with an etching solution. Materials of the identification patterns 120 are X-ray transparent materials, and under X-ray irradiation, the positions of the identification patterns 120 can be determined.

Figure 3:
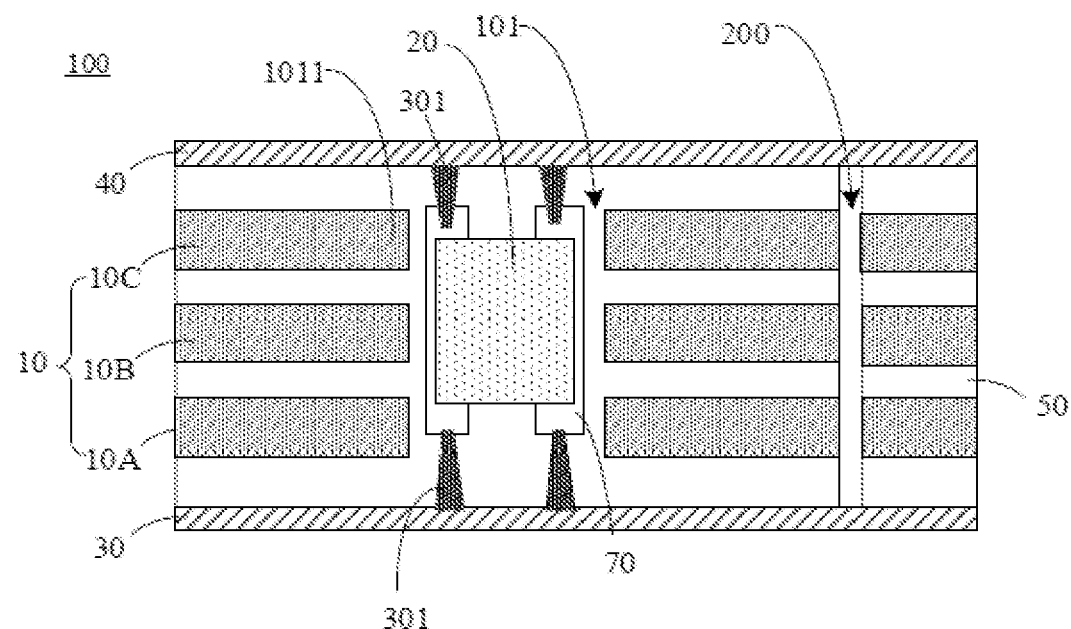
FIG. 3 is a schematic structural diagram of still another embodiment of an embedded circuit board of the present disclosure.
Figure 4:
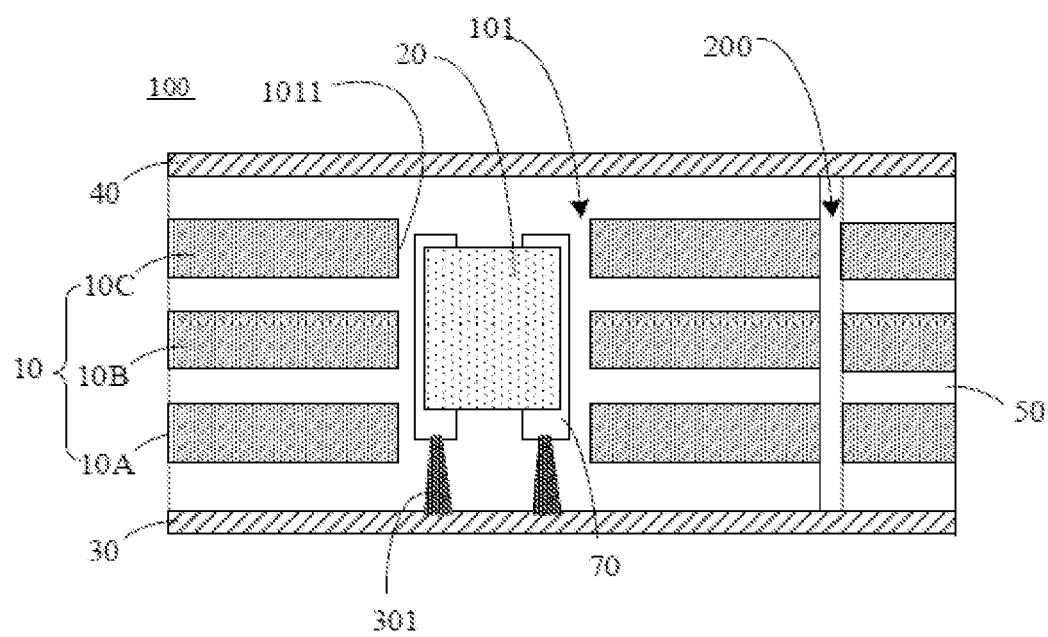
FIG. 4 is a schematic structural diagram of still another embodiment of an embedded circuit board of the present disclosure.

With reference to FIGS. 3-4, inductance frames 70 are provided to enclose an exterior of an inductance element 20, and are configured to assist the inductance element 20 in maintaining an upright state when sub-bodies 10 are provided to sleeve the inductance element 20 by means of slots 101, such that the inductance element 20 always maintains a predetermined distance from sidewalls 1011 of the slots.

The distance between the inductance frames 70 and the sidewalls 101 of the slots is 80 to 120 um.

The inductance frames 70 are made of conductive materials. The induction element 20 is connected to the first circuit layer 30 via the inductance frames 70 and conductive columns 301 connected to the inductance frames 70. Alternatively, the second circuit layer 40 may be provided with laser holes in which the conductive columns are arranged. The inductance element 20 is connected to the conductive columns via ends of the inductance frames 70 adjacent to the second circuit layer 40 to realize electrical connection to the second circuit layer 40.

It is further possible to provide laser through-holes at positions of the first circuit layer 30 and the second circuit layer 40 corresponding to the inductance frames 70, and to provide conductive columns in the laser through-holes. The inductance element 20 is connected to the conductive columns via the inductance frames 70, thereby realizing electrical connection of the inductance element 20 to the first circuit layer 30 and the second circuit layer 40.

Figure 5:
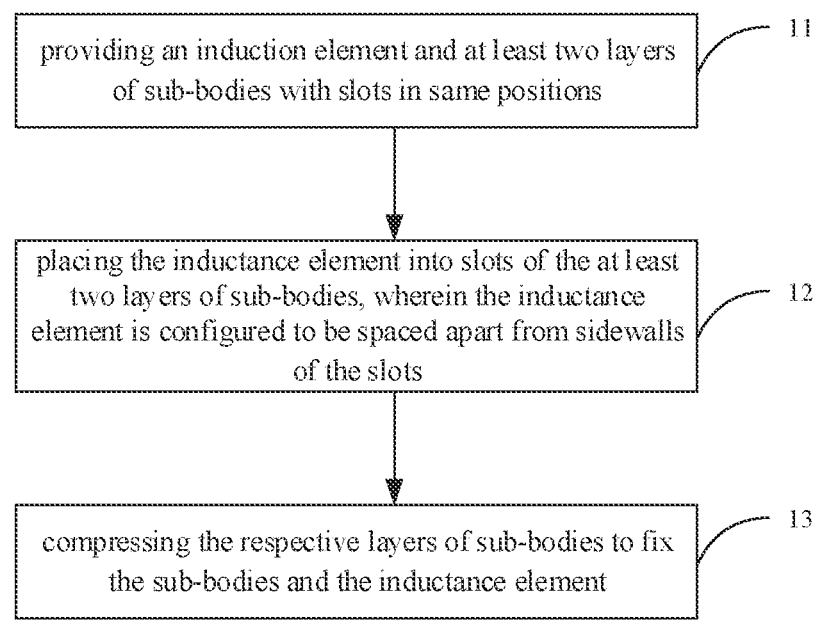
FIG. 5 is a schematic flow diagram of an embodiment of a method of manufacturing an embedded circuit board according to the present disclosure.

A method of manufacturing the embedded circuit board can include operations at blocks illustrated in FIG. 5.

The method can begin at block 11. an inductance element and at least two layers of sub-bodies with slots at same positions may be provided.

An inductance element and at least two layers of sub-body are provided. Moreover, the at least two layers of sub-bodies are provided with through slots at same positions. The sub-bodies can be made of copper-free cores, or other materials that can be used to manufacture circuit boards.

At block 12, the method may include the inductance element may be placed into slots of the at least two layers of sub-bodies, where the inductance element is configured to be spaced apart from sidewalls of the slots. The step is as follows.

(1) The inductance element is placed into a slot of a first layer of sub-body.

Alternatively, the inductance element is embedded on inductance frames to form an inductance assembly. The inductance frames are configured to assist the inductance element in maintaining an upright state in the process of sleeving the inductance element with the sub-bodies by means of the slots, such that the inductance element always maintains a preset distance from the sidewalls of the slots.

The inductance assembly is placed into and bonded to the slot of the first layer of sub-body. The purpose of bonding the inductance assembly to the first layer of sub-body is to prevent the inductance assembly from tilting, such that the inductance assembly remains upright.

In an embodiment, an adhesive tape may be used to bond the inductance assembly to the first layer of sub-body. If the adhesive tape is used in this step to bond the inductance assembly to the first layer of sub-body, a non-adhesive part is left; and the adhesive tape is removed through the non-adhesive part after the inductance element is not easily tilted or not tilted. It could be understood that, the adhesive tape needs to be de-energized prior to compression. In other embodiments, a hot glue or glue may be used to bond the inductance assembly to the first layer of sub-body.

(2) The remaining sub-bodies are configured to sleeve the inductance element in sequence.

In an embodiment, the following steps may be followed for implementation.

A plurality of first fusible dielectric layers and the remaining sub-bodies are alternately laminated to sleeve the inductance element in sequence. A first circuit layer is provided to cover a first fusible dielectric layer on an outermost side; and a second fusible dielectric layer and a second circuit layer are sequentially provided to cover a side of the first layer of sub-body away from the first circuit layer.

In other embodiments, the following steps may be followed for implementation.

The second circuit layer, the second fusible dielectric layer, and the first layer of sub-body are placed in sequence; the inductance element is accommodated in the slot of the first layer of sub-body; the remaining first fusible dielectric layers and the remaining sub-bodies are alternately laminated to sleeve the inductance element in sequence; and the first circuit layer is provided to cover the first fusible dielectric layer on the outermost side.

Alternatively, identification patterns may be provided at corresponding positions of the first fusible dielectric layers and the sub-bodies. Positioning holes, which are set according to the identification patterns, are configured to align the respective layers of sub-bodies and the first fusible dielectric layers. Accordingly, when the first fusible dielectric layers and the remaining sub-bodies are alternately laminated to sleeve the inductance element in sequence, the inductance element may accurately fall into the slots of the sub-bodies, without being damaged, thereby improving the yield.

Further, the sub-bodies, the first fusible dielectric layers and the second fusible dielectric layer may be subjected to patterning treatment to form identification patterns. Through the identification patterns, through-holes are formed on the sub-bodies, the first fusible dielectric layers and the second fusible dielectric layer. The through-holes are subjected to copper electroplating to form conductive layers on inner walls of the through-holes to obtain conductive holes. Conductive blind holes are provided at positions of the first circuit layer and the second circuit layer corresponding to the conductive holes. As such, it is possible to implement electrical connection of connection terminals of the inductance element to the conductive blind holes of the second circuit layer via the conductive blind holes of the first circuit layer and the conductive holes in sequence.

Alternatively, the first-layer of sub-body, the first circuit layer and/or the second circuit layer are laser-drilled according to the identification patterns on the sub-body layers, to form laser through-holes on the first layer of sub-body, the first circuit layer and/or the second circuit layer. Therein, the identification patterns on the sub-body layers are arranged to correspond to the connection terminals of the inductance element; and conductive columns are arranged in the laser through-holes, such that the connection terminals of the inductance element are connected to the first circuit layer and/or the second circuit layer via the conductive columns.

The sub-bodies can be copper clad laminates, and copper foil layers on the copper clad laminates are etched via a chemical etching process to form identification patterns. The chemical etching process refers to a method of removing materials by etching with an etching solution. Materials of the identification patterns are X-ray transparent materials. Under the action of X-rays, positions of the identification patterns can be determined, thereby facilitating setting the positioning holes.

A second dielectric layer may be provided between the inductance element and the sidewalls of the slots, such that the inductance element is more securely bonded to the sidewalls of the slots.

The second dielectric layer, the second fusible dielectric layer and the first fusible dielectric layer may be one or any combination of resin and molding silicone resin glue. The molding silicone resin glue, which is a colorless and transparent liquid, has certain air permeability and elasticity, when solidified, and is mainly characterized by temperature resistance, weather resistance, electrical insulation, physiological inertia, low surface tension and low surface energy. The resin refers to an organic polymer, which has a softening or melting range after being heated, has a tendency to flow under the action of external forces when softened, and is in a state of solid, semi-solid, or sometimes liquid at an ambient temperature.

At block 13, the method may include the respective layers of sub-bodies may be compressed to fix the sub-bodies and the inductance element.

Specifically, the second circuit layer, the second fusible dielectric layer, the respective sub-body layers, the plurality of first fusible dielectric layers, and the first circuit layer are compressed to fix the second circuit layer, the sub-body layers, the inductance element and the first circuit layer.

During high-temperature compression, the first fusible dielectric layers may melt thereby to bond the respective sub-body layers and the first circuit layer together. The second fusible dielectric layer may also melt to bond the first circuit layer and the adjacent sub-body layers together. A part of the first fusible dielectric layers with certain flowability enters the slots to engage with the melted second dielectric layer to form an integral structure after solidification.

Figure 6:
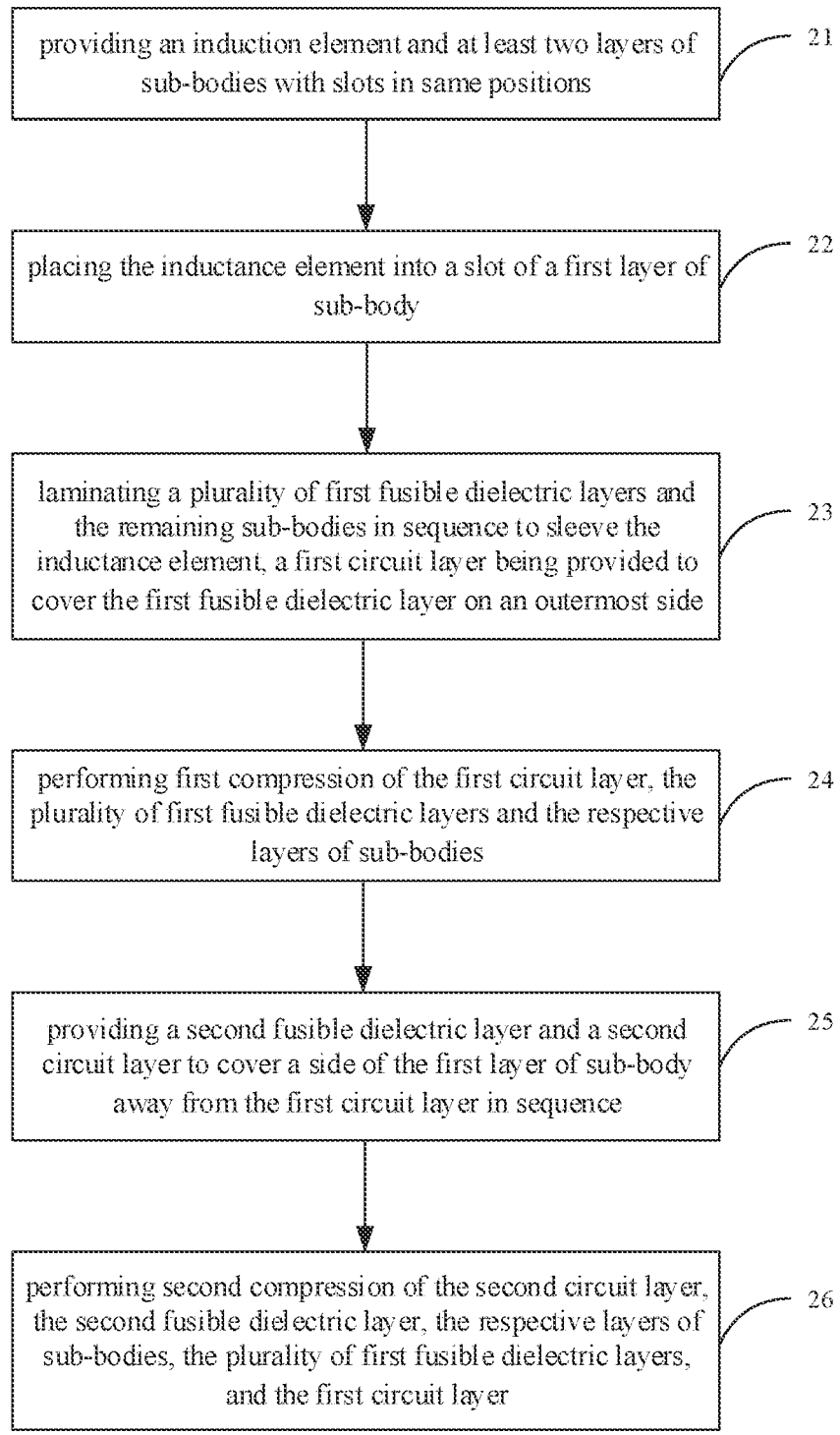
FIG. 6 is a schematic flow diagram of another embodiment of a method of manufacturing an embedded circuit board according to the present disclosure.

Another embodiment of the method of manufacturing the embedded circuit board can include operations at blocks illustrated in FIG. 6.

At block 21, the method may include an inductance element and at least two layers of sub-bodies with slots at same positions may be provided.

This step is identical to that in the foregoing embodiment, and details are omitted herein.

At block 22, the method may include the inductance element may be placed into a slot of a first layer of sub-body.

This step is identical to that in the foregoing embodiment, and details are omitted herein.

At block 23, the method may include a plurality of first fusible dielectric layers and the remaining sub-bodies may be alternately laminated to sleeve the inductance element in sequence, and a first circuit layer may be provided to cover a first fusible dielectric layer on an outermost side.

Prior to covering the first fusible dielectric layer on the outermost side, it is possible to add a second dielectric layer between the inductance element and sidewalls of the slots, such that the inductance element is more securely bonded to the sidewalls of the slots.

At block 24, the method may include, first compression of the first circuit layer, the plurality of first fusible dielectric layers and the respective layers of sub-bodies may be performed.

After the first circuit layer, the respective first fusible dielectric layers, the sub-body layers and the covering are completed, the first compression is performed. During a high-temperature compression process, the first fusible dielectric layers are heated to melt to bond the respective adjacent sub-body layers and the first circuit layer together; and the second dielectric layer is also heated to melt to bond the inductance element and the sidewalls of the slots together. Moreover, a part of the first fusible dielectric layers enters the slots to be bonded to the second dielectric layer. After being cooled, the respective first fusible dielectric layers and the second dielectric layer form an integral structure. The first circuit layer, the sub-bodies and the inductance element are fixed.

At block 25, the method may include, the second fusible dielectric layer and the second circuit layer may be provided to cover a side of a first layer of sub-body away from the first circuit layer.

The second fusible dielectric layer is provided to cover a side of the first layer of sub-body away from the first circuit layer, and the second circuit layer is provided to cover a side of the second fusible dielectric layer away from the first layer of sub-body.

At block 26, the method may include second compression of the second circuit layer, the second fusible dielectric layer, the respective sub-body layers, the plurality of first fusible dielectric layers and the first circuit layer may be performed.

After the second fusible dielectric layer and the second circuit layer are provided for covering, second compression is performed. During a second high-temperature compression process, the respective first fusible dielectric layers and the second dielectric layer melt again. It is possible to further compress the respective sub-body layers in a more compact manner to reduce a thickness of the circuit board. The second fusible dielectric layer melts to bond the second circuit layer and the first layer of sub-body together, thereby fixing the second circuit layer, the sub-body layers, the inductance element and the first circuit layer.

Advantageous effects of the present disclosure are as follows. Distinct from the case of the prior art, the present disclosure may make a circuit board structurally compact, highly integrated, and safe and reliable by simple process steps of providing communicating slots at corresponding positions of adjacent sub-bodies, respectively, embedding an inductance element within the slots, configuring the inductance element to be spaced apart from sidewalls of the slots and performing compression via a compression process.

The foregoing are merely embodiments of the present disclosure, and do not thus limit the patent scope of the present disclosure. Any equivalent structure or equivalent process transformation made using contents of the specification and drawings of the present application, or applied directly or indirectly to other related technical fields, shall likewise be included within the scope of patent protection of the present disclosure.

What is claimed is:

1. An embedded circuit board, comprising:
   at least one layer of sub-body, wherein through slots are provided at presets positions of the sub-bodies;
   an inductance element embedded within the slot and configured to be spaced apart from sidewalls of the slots;
   a first circuit layer arranged with conductive columns;
   a second circuit layer, the first circuit layer and the second circuit layer being provided to cover two opposite sides of the slot respectively such that the inductance element is located between the first circuit laver and the second circuit layer, and
   inductance frames, enclosing an exterior of the inductance element;
   wherein the induction element is connected to the first circuit layer via the inductance frames and the conductive columns connected to the inductance frames, the inductance element is connected to the conductive columns via ends of the inductance frames adjacent to the second circuit layer to realize electrical connection to the second circuit layer; and
   the inductance frames are configured to assist the inductance element in maintaining an upright state when the sub-bodies are provided to sleeve the inductor element by means of the slots, such that the inductance element always maintains a preset distance from the sidewalls of the slots.

2. The embedded circuit board according to claim 1, wherein:
   the number of sub-bodies is greater than or equal to 2; and
   wherein a fusible dielectric layer is provided between two adjacent layers of sub-bodies thereof, and the at least two layers of sub-bodies are formed by laminating and compressing the fusible dielectric layers, after sleeving the induction element by means of the slots, at least a part of the fusible dielectric layers flowing into space between the inductance element and the sidewalls of the slots and contacting the inductance element.

3. The embedded circuit board according to claim 2, wherein:
   a thickness of the fusible dielectric layer is 40 to 300 um; and
   wherein the sub-bodies are copper-free core layers with a thickness of 200 to 500 um.

4. The embedded circuit board according to claim 3, wherein the inductance element has connection terminals electrically connected to at least one of the first circuit layer and the second circuit layer.

5. The embedded circuit board according to claim 4, wherein at least one of the first circuit layer and the second circuit layer is provided with laser through-holes provided with conductive columns; and
   wherein the connection terminals of the inductance element are connected to the at least one of the first circuit layer and the second circuit layer via the conductive columns.

6. The embedded circuit board according to claim 4, wherein:
   corresponding positions of the sub-bodies and the fusible dielectric layer are each provided with conductive holes for interlayer connection;
   wherein positions of the first circuit layer and the second circuit layer corresponding to the conductive holes are provided with conductive blind holes; and
   wherein the connection terminals of the inductance element are electrically connected to the conductive blind holes of the second circuit layer via the conductive blind holes of the first circuit layer and the conductive holes in sequence.

7. The embedded circuit board according to claim 4, wherein the embedded circuit board further comprises:
   at least one component provided on a side of at least one of the first circuit layer and the second circuit layer away from the slot and electrically connected to the induction element via the at least one of the first circuit layer and the second circuit layer, wherein the components are at least one of chips, capacitance elements, resistance elements, and power supply means.

8. The embedded circuit board according to claim 1, wherein:
   the number of sub-bodies is greater than or equal to 2; and
   wherein a first dielectric layer is provided between the two adjacent layers of sub-bodies, and a second dielectric layer is provided between the inductance element and the sidewalls of the slots, the first dielectric layer and the second dielectric layer being welded by one-time compression.

9. The embedded circuit board according to claim 8, wherein
   the at least two layers of sub-bodies are provided with identification patterns, slots of the respective layers of sub-bodies being set with the identification patterns as reference and being identically shaped and sized, wherein the slots are configured to align the respective layers of sub-bodies and to accurately sleeve the inductance element by means of the slots, before compressing all the sub-bodies.

10. The embedded circuit board according to claim 9, wherein:
   the identification patterns are further configured to position the connection terminals of the inductance element, and wherein the first layer of sub-body and the first dielectric layer adjacent to the first layer of sub-body are laser-drilled according to the identification patterns, and at least one of the first circuit layer and the second circuit layer is laser-drilled, such that laser through-holes are formed on the first layer of sub-body and the first dielectric layer adjacent to the first layer of sub-body, and laser through-holes are also formed on the at least one of the first circuit layer and the second circuit layer.

11. The embedded circuit board according to claim 9, wherein:
materials of the identification patterns are X-ray transparent materials.

12. The embedded circuit board according to claim 1, wherein the distance between the inductance frames and the sidewalls of the slots is 80 to 120 um.

\* \* \* \* \*